April 1, 1969 R. W. FENTON ET AL 3,436,671

GAIN AND ATTENUATION CONTROL CIRCUIT ARRANGEMENTS

Filed Jan. 7, 1966 Sheet 1 of 2

INVENTORS
Roger Wakefield Fenton
and
George Leslie Cooper
BY Baldwin & Wight
ATTORNEYS INVENTORS
Roger Wakefield Fenton
and
George Leslie Cooper
BY Baldwin & Wight
ATTORNEYS United States Patent Office 3,436,671

Patented Apr. 1, 1969

3,436,671
GAIN AND ATTENUATION CONTROL CIRCUIT ARRANGEMENTS

Roger Wakefield Fenton, Writtle, and George Leslie Cooper, Chelmsford, England, assignors to The Marconi Company Limited, London, England, a British company Filed Jan. 7, 1966, Ser. No. 519,201
Claims priority, application Great Britain, Jan. 19, 1965, 2,377/65
Int. Cl. H03g 3/30
U.S. Cl. 330—29 11 Claims

ABSTRACT OF THE DISCLOSURE

A remotely controllable gain control arrangement includes a Wheatstone bridge, one arm of which includes a remote adjustable resistance and an energy sensitive resistance such as a photosensitive resistor element. Preferably the bridge output is employed to control the photosensitive resistor to maintain bridge balance upon adjustment of the remote resistance. The photosensitive resistor is included in a voltage divider circuit included in a channel to provide gain adjustment of wide band signals applied to the channel by adjustment of the remote resistance, controlling the resistance of the photosensitive resistance.

Figure 1:
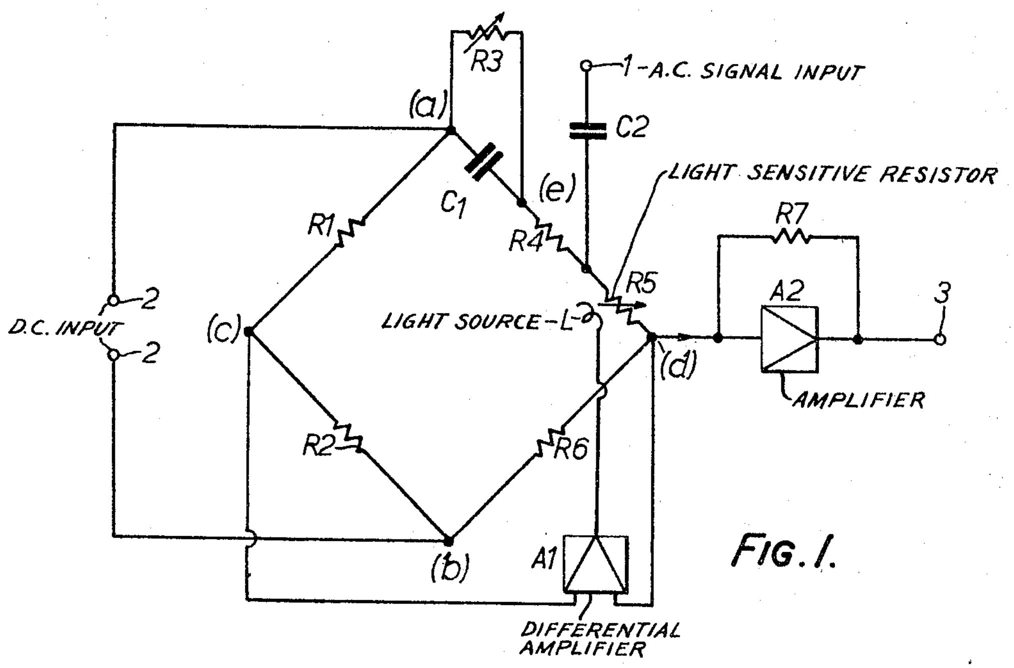

This invention relates to gain and attenuation control circuit arrangements—hereinafter termed, for brevity, simply gain control arrangements—and has for its object to provide improved gain control arrangements adapted to effect remote control of wide band signal circuits such, for example, as amplifier circuits for television video signals.

The problem of effecting remote control of the gain of a wide band amplifier, such as a video signal amplifier, without altering the frequency response characteristics of the amplifier is very difficult to solve especially if the amplifier is of the transistor type. Numerous remotely actuated gain control arrangements have been proposed but, so far as the present applicants are aware, they all present one or more of the following defects, namely: insufficient range of control; inadequate bandwidth and/or linearity and/or signal handling capacity; inadequate temperature stability i.e. an inadequate degree of independence of temperature variation; and inadequate precision and constancy of the relation between the setting of the gain control and the gain actually obtained. In the case of a wide band transistor amplifier, gain control circuits at present in general use accompany adjustments of gain with undesired variations of frequency response. In many cases the connection to a wide band amplifier of long leads extending from a remote point and provided in order to connect gain controlling devices to circuit points in said amplifier result in loss of signal quality in the signals handled by the amplifier. The present invention seeks to provide improved gain control arrangements suitable for remote control and which will effect gain adjustment without the foregoing defects and disadvantages by a control circuit carrying only direct current.

According to this invention a gain control arrangement suitable for use for the remote control of the gain of a wide band signal chanel comprises in said channel a potentiometer to which the wide band input signals are applied and from a portion of which wide band signals are taken off; a resistance sensitive to energy of a particular kind included in said potentiometer; a direct current circuit including at least a portion of said potentiometer; means for adjusting the value of a direct current fed to said direct current circuit; a source adapted to apply said particular kind of energy to said resistance, the source being electrically unconnected to said resistance; and means operated automatically in dependence upon the relation between the direct current voltage at a point in said potentiometer and a point of reference direct current potential for controlling said particular energy applied by said source to said resistance to maintain said relation substantially at a predetermined value, whereby the gain of the wide band signal channel is made dependent upon the adjusted value of the aforesaid direct current.

The resistance sensitive to energy may be a resistance sensitive to the strength of a magnetic field applied thereto but as present such resistances known to us require relatively high magnetic fields the resistance is preferably one sensitive to heat or light.

Preferably a portion of the potentiometer is included in one arm of a Wheatstone bridge which also includes means for adjusting the direct current flowing through a bridge arm (which may be the aforesaid one arm) and wide band output signals are taken off at a point in said bridge in an arm which is opposite another bridge point constituting the point of reference direct current potential, the heat or light source being controlled by a differential direct current amplifier responsive to the difference between the potentials at the two said bridge points. Preferably the differential direct current amplifier is a transistor amplifier. The heat or light sensitive resistance may be included in the aforesaid arm of the Wheatstone bridge but it may be included in another arm of the bridge.

The wide band output signals may be fed to a following high gain amplifier providing overall phase inversion. The input impedance of this amplifier may constitute part of the aforesaid potentiometer and said amplifier may have a feedback circuit which is connected across it and is so dimensioned as to make input impedance of very low value. Where such a following amplifier is provided the heat or light sensitive resistance, instead of being connected in an arm of the Wheatstone bridge, may be included in the feedback circuit.

Where quick response to gain control adjustment is required a light sensitive resistance should be employed and the source should, of course, be a light source. Where, however, a certain time lag in response to gain control adjustment is acceptable a heat sensitive resistance in conjunction with a heat source may be used.

Adjustment of the direct current value for gain control may be effected by means of a variable D.C. potential source or by means of a variable resistance.

Figure 2:
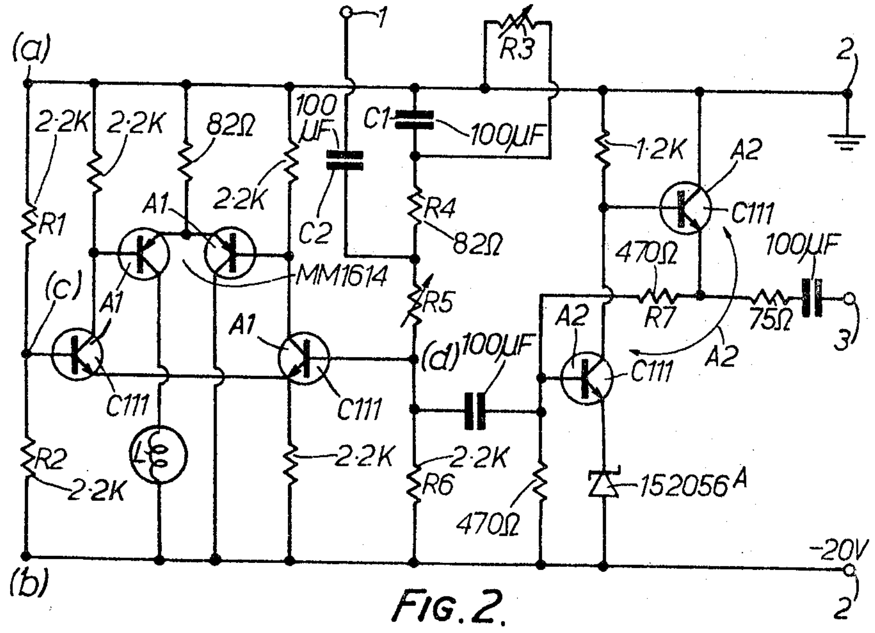
Figure 3:
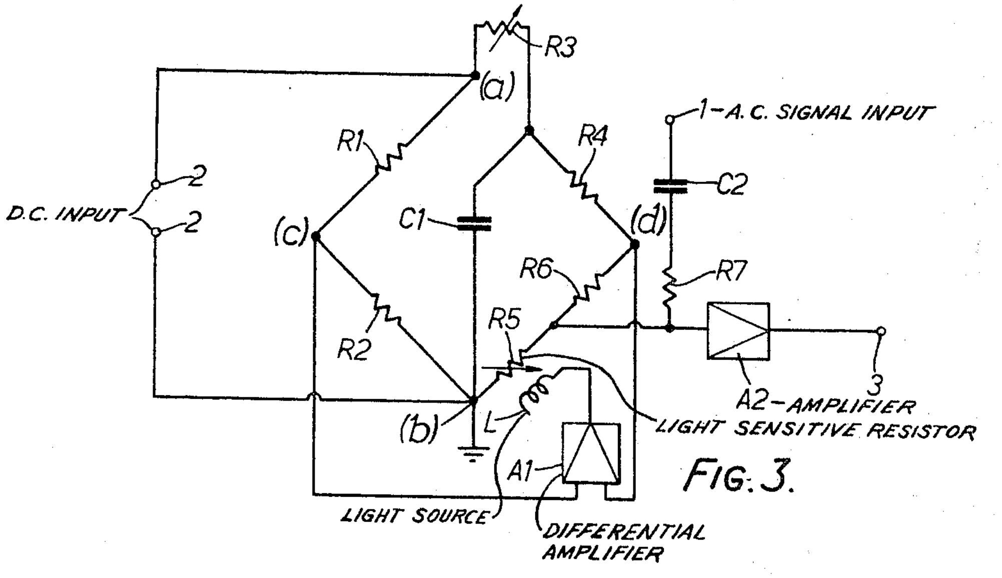
Figure 4:
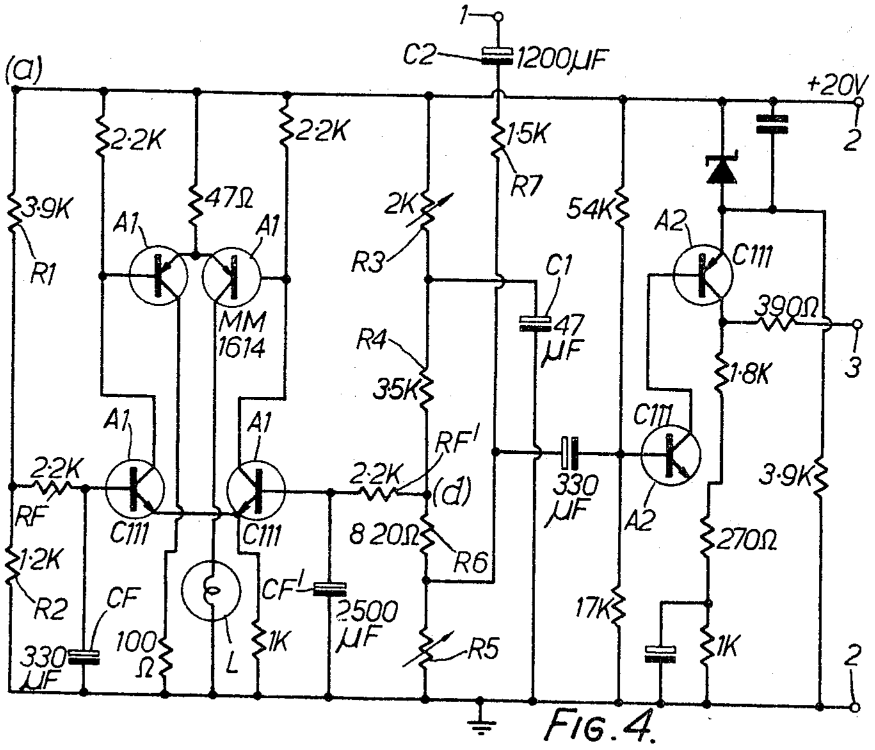

The invention is illustrated in the accompanying drawings. In the drawings FIGURE 1 is a simplified diagram of one embodiment; FIGURE 2 shows the same embodiment in greater circuit detail; FIGURE 3 is a simplified diagram of another embodiment and FIGURE 4 shows the embodiment of FIGURE 3 in greater detail. Like references denote like parts in the two figures where possible. The circuit element values and types given in FIGURES 2 and 4 are by way of example only and in no sense limiting. They are suitable for the case where the frequency band to be handled is a video band extending from, say 20 c./s. to 20 mc./s.

Referring to FIGURE 1 video signal input is applied at terminal 1 via a coupling condenser $C_2$ to one end of a light sensitive resistance $R_5$ which is included in one arm of a Wheatstone bridge. The same arm includes also a resistance $R_4$ and a remotely situated adjustable resistance $R_3$ which is the gain adjustment device and is connected across a condenser $C_1$. The other three arms of the bridge are constituted respectively by the resistances $R_1$, $R_2$ and $R_6$. A light source positioned to illuminate the resistance $R_5$ is indicated at L. The resistance $R_5$ is in practice constituted by a photoconductive cell. Units each comprising such a cell and an illuminating lamp therefor are commercially available. The four "corner" points of the bridge are references $a$, $b$, $c$ and $d$. A D.C. supply source (not shown) is connected at terminals 2 across one pair of opposite points $a$ and $b$. A differential D.C. amplifier $A_1$ the output from which energizes the light source L has its two inputs connected respectively to the other opposite points $c$ and $d$ of the bridge. The point $d$ is connected through a wide band amplifier $A_2$ which provides overall phase reversal to the final video signal output terminal 3 and a feedback resistance $R_7$ is connected across the amplifier $A_2$ The resistance $R_4$ in conjunction with the condenser $C_1$ prevents the video signal input applied at terminal 1 and coupled through the coupling condenser $C_2$ reaching the remote control circuit consisting of resistance $R_3$ and its leads, which circuit carries substantially only direct current. The sense of connection of the inputs and output of the differential amplifier $A_1$ are, of course, so chosen that the control of the light from the source L and therefore of the value of $R_5$, restores the bridge to balance when $R_3$ is varied. The greater the gain of amplifier $A_1$ the closer to balance is the bridge maintained.

When the bridge is balanced $$R_3+R_4+R_5=\frac{R^1R_6}{R_2} \quad (1)$$

whence $$R_5=\frac{R_1R_6}{R_2}(R_3+R_4) \quad (2)$$

so that the value of $R_5$ is linearly related to that of $R_3$ if the gain of the differential amplifier $A_1$ is taken as infinite. This is permissible since, in practice, the amplifier gain can readily be arranged to ensure an error of less than 1% in the value of $R_5$.

The cell resistance $R_5$ constitutes the signal source resistance presented to the amplifier $A_2$ if it be assumed that the terminal 1 is fed from a signal source (not shown) of zero impedance. It will be observed that $R_5$ forms part of a potentiometer or voltage divider circuit of which the input impedance of amplifier $A_2$ forms another part. The design is such that this input impedance approximates to zero and accordingly the video signal voltage at the input of amplifier $A_2$ will be very small. Accordingly the differential amplifier $A_1$ will have only a very small video signal voltage between its input terminals and its operation as a D.C. amplifier will hardly be disturbed at all even if a large video signal input is applied at terminals 1.

The effective voltage gain (output voltage-input voltage ratio) of the amplifier $A_2$ will be approximately the same as the ratio $R_7/R_5$. The value of $R_5$ is determinable from Equation 2 above and therefore the effective gain of the amplifier $A_2$ may be adjusted in definite predetermined manner by adjustment of the resistance $R_3$. The cell resistance $R_5$ is, of course, in practice quite sensitive to ambient temperature variations but this is prevented from introducing undesired variations of gain by the action of amplifier $A_1$ in controlling the light from the lamp L and thus automatically compensating for variations in $R_5$ which would otherwise occur due to temperature variations. Thus the overall gain is substantially determined by the setting of $R_3$ and the value of the feedback resistance $R_7$. Moreover as will now be seen the gain control adjustment is effected solely by adjusting a D.C. current, and, there being no electrical connection between the lamp and the controlled resistance $R_5$, adjustment of gain has no effect upon frequency response.

Various modifications of the circuit are possible. Thus, in place of the variable resistance $R_3$ for gain control adjustment an adjustable source of potential connected between the bridge corners $a$ and $c$ could be used. With this modification the gain of the system will be determined by the D.C. voltage applied at terminals 2, the setting of the adjustable potential source provided between $a$ and $c$, and the value of $R_7$. Again the positions of the resistances $R_7$ and $R_5$ could be interchanged in the circuit, the lamp L, of course, still illuminating the resistance $R_5$. Obviously this modification only amounts, in effect, to making the portion of the potentiometer constituted by the input impedance of the amplifier $A_2$ variable, $R_5$ becoming a variable feedback resistor. Moreover the resistance $R_5$ illuminated by the lamp L could be moved to any of the other arms of the bridge, but with the illustrated arrangement of FIGURE 1, the total resistance in the bridge arm between points $a$ and $d$ is, at bridge balance, the same for all settings of $R_3$ and therefore the D.C. potential and circuit resistance presented to the differential amplifier $A_1$ remain the same. This simplifies design of the amplifier $A_1$. Finally the amplifier $A_2$ with its feedback resistance $R_7$ are not essential and can be omitted for, since resistance $R_6$ is also part of the potentiometer, the final video output can be taken from point $d$. With this modification, however, it will usually be necessary to provide means, such as a low pass filter, for excluding video signals from the input to amplifier $A_1$.

The more detailed circuit of FIGURE 2 requires little further description having regard to the use therein of corresponding references to those used in FIGURE 1. As before $R_5$ is a photoconductive cell illuminated by the lamp L and $R_1$, $R_2$, $R_6$ and $R_4$ are the other resistances in the bridge. The amplifier $A_1$ comprises the four transistors (indicated as of type MM1614 and C111) referenced as $A_1$ in FIGURE 2 and the amplifier $A_2$, having the feedback resistance $R_7$ across it, comprises the two transistors (type C111 in FIGURE 2) both of which are referenced $A_2$ in FIGURE 2.

FIGURE 3 shows, in manner similar to FIGURE 1, one of the many variants of FIGURE 1 which are possible. In FIGURE 3 the light sensitive resistor $R_5$ is in the bridge arm $b$–$d$ and forms with resistance $R_7$, a potentiometer which is (in series with the condenser $C_2$) between the input terminal 1 and earth. The tap of this potentiometer is at the junction point of $R_7$ with $R_5$ which is also the junction point of $R_6$ with $R_5$—the two elements in the bridge arm $b$–$d$. This tap is connected to the input of the amplifier $A_2$ which is now an amplifier having a high input impedance. The light source L illuminating $R_5$ is again fed from the differential amplifier $A_1$ as before but, because $R_5$ is in the arm $b$–$d$ instead of in the arm $a$–$d$, the lamp L is fed from the right hand output transistor of amplifier $A_1$ as in FIGURE 4 instead of from the left hand one as in FIGURE 2 in order to obtain the correct sense of feedback.

The condition for balance of the bridge in FIGURES 3 and 4 is:

$$R_3+R_4=\frac{R^1}{R_2}(R_5+R_6) \quad (3)$$

whence $$R_5=\frac{R_2}{R_1}(R_3+R_4)-R_6 \quad (4)$$

so that there is again a linear relationship between $R_5$ and the remote control resistor $R_3$.

In the arrangement of FIGURES 3 and 4 a video signal of significant amplitude can exist at the point $d$ and may, perhaps, be such as could disturb the proper operation of the amplifier $A_1$. This is prevented, as will be seen from FIGURE 4, by providing resistance-capacity filters in the input circuits of the two transistors of the amplifier $A_1$. The elements of these filters are referenced CF, RF in the one case and CF′, RF′ in the other.

We claim:

1. A gain control arrangement suitable for use for the remote control of the gain in a wide band signal channel and comprising voltage divider means including an energy sensitive resistance element having a resistance dependent upon energy applied thereto; means associated with said energy sensitive resistance element for applying energy thereto to determine the resistance thereof; means for applying an A.C. signal to said voltage divider means and means for taking an output A.C. signal therefrom; direct current circuit means for the establishment of a first point of D.C. reference potential upon the passage of a direct current therethrough, said direct current circuit means being connected to said voltage divider means and including therein a part of said voltage divider means for passing a direct current therethrough to establish a second point of D.C. potential in said voltage divider means; means connected with both said points of D.C. potential and responsive to the relative magnitude of the D.C. potentials at said points for controlling the energy applied to said energy sensitive resistance element to control the resistance thereof and the gain of said output A.C. signals from said voltage divider means with respect to the A.C. signal applied thereto; and means for varying the direct current in said direct current circuit means for varying the D.C. potential of at least one of said points for varying the energy applied to said energy sensitive resistance element and thereby varying said gain.

2. A gain control arrangement according to claim 1 wherein said energy sensitive resistance element is sensitive to magnetic fields.

3. A gain control arrangement according to claim 1 wherein said energy sensitive resistance element is sensitive to heat.

4. A gain control arrangement according to claim 1 wherein said energy sensitive resistance element is sensitive to light.

5. The arrangement according to claim 1 wherein said direct current circuit means comprises a Wheatstone bridge, a portion of said voltage divider means being included in one arm of said Wheatstone bridge, said means for varying the current in said direct current circuit means comprising means for adjusting direct current in said Wheatstone bridge, said first and second points of D.C. potential being located in said bridge, said means for taking an output A.C. signal from said voltage divider means being connected to said second point of D.C. potential and said means for controlling the energy applied to said energy sensitive resistance element comprising a direct current differential amplifier having two inputs connected with said first and second points of D.C. potential, said means for applying energy comprising an energy source connected with an output from said differential amplifier for varying the energy applied to said energy sensitive resistance in response to variations in the potential difference between said first and second points of D.C. potential.

6. An arrangement as claimed in claim 5 wherein said energy sensitive resistance element is connected into an arm of said Wheatstone bridge.

7. An arrangement as claimed in claim 6 wherein said means for taking output A.C. signals from said voltage divider means comprises high gain amplifier means providing overall phase inversion.

8. An arrangement as claimed in claim 7 wherein said energy sensitive resistance element and said means for adjusting the direct current are included in the same arm of said Wheatstone bridge, the input impedance of said high gain amplifier means constituting part of said voltage divider means.

9. An arrangement as claimed in claim 8 wherein said high gain amplifier means includes feedback circuit means connected thereacross and providing a very low value of said input impedance.

10. An arrangement as claimed in claim 5 wherein said means for taking an output A.C. signal comprises high gain amplifier means providing overall phase inversion having a feedback circuit connected thereacross, said energy sensitive resistance element being included in said feedback circuit.

11. The arrangement according to claim 1 wherein said means for taking an output A.C. signal from said voltage divider means comprises an output amplifier having an input impedance, the input impedance of said amplifier being connected into said voltage divider means to form a part of said voltage divider means.

References Cited

UNITED STATES PATENTS

| | | | |
|---|---|---|---|
| 2,130,517 | 9/1938 | Wilson | 330—143 X |
| 2,572,108 | 10/1951 | Chalhoub | 330—143 |

FOREIGN PATENTS

| | | |
|---|---|---|
| 300,207 | 9/1954 | Switzerland. |

OTHER REFERENCES

Weisbecker: Electronic Design, Aug. 30, 1965, pp. 32, 34, 35.

ROY LAKE, *Primary Examiner.*

SIEGFRIED H. GRIMM, *Assistant Examiner.*

U.S. Cl. X.R.

330—59, 143, 144, 146, 155, 183